United States Patent [19]
Clements

[11] Patent Number: 5,258,577
[45] Date of Patent: Nov. 2, 1993

[54] DIE MOUNTING WITH UNIAXIAL CONDUCTIVE ADHESIVE

[76] Inventor: James R. Clements, 5840 Darbwood La., West Bloomfield, Mich. 48033

[21] Appl. No.: 796,453

[22] Filed: Nov. 22, 1991

[51] Int. Cl.⁵ .................. H01L 27/00; H05K 1/00; H05K 3/00
[52] U.S. Cl. ..................... 174/88 R; 29/832; 174/94 R; 174/259; 174/260; 361/779; 439/66
[58] Field of Search ............ 174/88 R, 94 R, 257, 174/259, 260; 357/80; 439/66, 91; 29/832; 361/411

[56] References Cited

U.S. PATENT DOCUMENTS

| | | | |
|---|---|---|---|
| 4,113,981 | 9/1978 | Fujita et al. | 174/88 R |
| 4,423,435 | 12/1983 | Test | 357/80 X |
| 4,640,981 | 2/1987 | Dery et al. | 174/88 R |
| 4,643,499 | 2/1987 | Mitchell | 439/66 |
| 4,667,401 | 5/1987 | Clements et al. | 29/832 |
| 4,744,850 | 5/1988 | Imano et al. | 174/117 AX |
| 4,811,081 | 3/1989 | Lyden | 357/80 |
| 4,868,637 | 9/1989 | Clements et al. | 174/88 RX |
| 4,927,368 | 5/1990 | Shino | 439/66 |
| 4,972,580 | 11/1990 | Nakamura | 174/88 RX |
| 5,065,506 | 11/1991 | Kiribayashi | 29/832 |

Primary Examiner—Morris H. Nimmo
Attorney, Agent, or Firm—Reising, Ethington, Barnard, Perry & Milton

[57] ABSTRACT

An electronic device is made by a method of connecting a circuit member to a substrate. The circuit member is of the type having a discontinuous passivating layer thereon with recesses therein establishing electrical contacts. The circuit member is connected to a mounting surface of a substrate having conductive paths. An adhesive including a resin with spaced conductive metal particles suspended therein is applied over the conductive paths. The distance between the electrical contacts and conductive paths is decreased to provide electrical conduction through the adhesive, while maintaining the adhesive between conductive paths non-conductive. The conductive paths may have established thereon raised or protruding contact surfaces over a portion thereof. The circuit member is mounted on the adhesive while vertically aligning the electrical contacts over pre-selected protruding contact surfaces. Pressure is applied to concentrate the conductive metal particles between the electrical contacts and conductive paths allowing conduction therethrough.

17 Claims, 3 Drawing Sheets

DIE MOUNTING WITH UNIAXIAL CONDUCTIVE ADHESIVE

TECHNICAL FIELD

The subject invention relates to electronic devices and electrically conductive adhesive therefore. More particularly, the invention relates to the connection of an electronic device to a substrate using a uniaxial conductive adhesive.

BACKGROUND ART

In many electrical applications, it is desirable to connect an electrical component with or without conductive terminals leads extending therefrom, to a substrate including a plurality of laterally spaced conductive paths. A current is passed between the aligned conductor contact of the electrical component to the substrate path. It is undesirable for current to pass between the electrical contacts causing shorting of the circuit.

Conventional methods have connected electrical components which include conductive terminals leads extending therefrom by soldering techniques. It is also known to use a uniaxial conductive adhesive resin for mounting electrical components having terminals extending therefrom, as disclosed in U.S. Pat. No. 4,667,401 issued May 26, 1987 in the name of Clements et al., common inventor to the subject application. The patent discloses a uniaxial conductive adhesive wherein pressure between two members causes conductivity therebetween by concentration of conductive metal particles within the resin, while the areas surrounding the depressed members remain non-conductive.

U.S. Pat. No. 4,113,981 to Fujita et al., issued Sep. 12, 1978 discloses an electrically conductive adhesive for connecting raised conductors or terminals of electronic devices. Pairs of connecting terminals are attached to plates such that the connecting terminals project from the surface of the plates. Upon pressure of the plates to one another, the terminal compressed the resin to obtain conductivity between metal particles within a resin. Portions between the plates absent the terminals are not conductive due to the left compression thereof as being recessed from the connecting terminals.

U.S. Pat. No. 4,640,981 issued Feb. 3, 1987 in the name of Dery et al. discloses electrical interconnection means which utilizes two members having printed thereon ink conductors. The members were placed facing one another with an adhesive therebetween. In order to obtain conductivity between the two members, pressure is applied to an area of one of the members to bring the conductive inks into contact with each other forcing the flow of adhesive therefrom.

It is known in the art to deposit layers to the conductive portions on the electrical contacts of the electrical component utilizing several plating steps, i.e. sputtering which is generally very expensive and time consuming. U.S. Pat. No. 4,811,081 issued Mar. 7, 1989 in the name of Lyden discloses use of an anisotropically electrically conductive adhesive which is used between a projecting contact pad and conductive path on a substrate.

However, this prior art is inapplicable to electrical components which do not have terminal leads or "bumps" extending therefrom. In general, these type of components include the passivating layer which is discontinuous exposing recessed areas of electrical contact pads. The passivating layer may have a thickness of 0.3-0.9 microns and is very fragile. The layer can not take the pressure of the prior art and isotropic adhesives. The above methods do not apply to this type of an electrical component due to the electrical contacts being recessed rather than extending therefrom allowing pressure directly thereon.

U.S. Pat. No. 4,423,435 issued Dec. 27, 1983 in the name of Test, II discloses use of an anisotropically electrically conductive adhesive solvent which is placed between contact pads and conductive paths of a substrate. As the solvent evaporates, the resin will contact predominantly along the Z axis remaining non-conductive along the X- and Y-axes. The resin is heated to activate the adhesive.

SUMMARY OF THE INVENTION

The invention is a method of forming an electronic device. The method includes the step of forming an electronic device comprising an electronic circuit member having a discontinuous insulation layer establishing recessed contact pads, a substrate with a mounting surface having conductive paths thereon and establishing raised conductive surfaces vertically aligned with the contact pads, the raised conductive surfaces have a height greater than the height of the conductive path vertically aligned with the insulation layer, an adhesive between the circuit member and the substrate having a resin and spaced conductive metal particles suspended therein with concentrated conductive particles between the raised conductive surfaces and contact pads allowing conductivity through the resin making the resin uniaxially conductive vertically therebetween while maintaining the adhesive between laterally spaced contact pads and conductive paths in the unconcentrated and nonconducting states.

Also included is a method including the steps of providing a substrate having laterally spaced conductive paths thereon, applying an adhesive on the substrate having a resin and spaced conductive metal particles suspended therein being in an unconcentrated and nonconductive state, placing an electronic circuit member having a discontinuous insulation layer establishing recessed contact pads over the adhesive with the contact pads vertically aligned with selective conductive paths, and applying pressure to the circuit member against the substrate to concentrate conductive particles between the conductive paths and contact pads allowing conductivity through the resin making the resin uniaxially conductive vertically therebetween while maintaining the adhesive between laterally spaced contact pads and laterally spaced conductive paths in the unconcentrated and nonconducting states.

The invention also includes an electronic device which comprises a circuit member mounted on the substrate. The circuit member includes a discontinued insulation layer which provides electrical contact pads recessed within the discontinuities. A substrate includes a mounting surface having a plurality of laterally spaced conductive paths thereon with a portion of the conductive paths establishing raised conductive surfaces vertically aligned with the recess. The conductive surfaces have a protruding height aligned with the recesses greater than the protruding height of the conductive paths vertically aligned with the insulation layer. An adhesive layer coating is applied to the raised conductive surfaces of the conductive paths for adhering the circuit member to the substrate. The adhesive includes concentrated conductive metal particles between the vertically aligned contact pads and raised conductive surfaces and is uniaxially conductive vertically therebetween, and unconcentrated and non-conductive between laterally spaced conductive pads and conductive surfaces wherein the resin is a dielectric preventing conductivity between the metal particles therein and being non-conductive laterally therebetween.

FIGURES IN THE DRAWINGS

Advantages of the present invention will be readily appreciated as the same becomes better understood by reference to the following detailed description when considered in connection with the accompanying drawings wherein.

DETAILED DESCRIPTION OF THE PREFERRED EMBODIMENT

Figure 1:
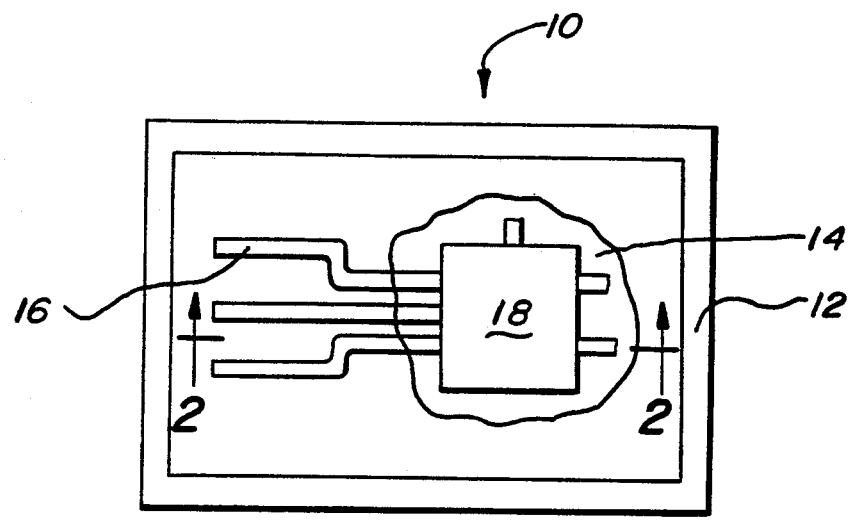
FIG. 1 is a plan view of a circuit member mounted on a substrate.

An electrical device constructed in accordance with the subject invention is generally shown at 10 in FIG. 1. The device includes a substrate generally indicated at 12. The substrate 12 is a supporting material on or in which parts of the circuit are attached or made. The substrate 12 may be passive or active.

The substrate 12 includes a mounting surface 14 having a plurality of laterally spaced conductive paths 16 thereon. This type of substrate 12 is generally referred to as a printed circuit board in which normally found interconnecting wires are replaced by conductive strips 16 printed, etched or otherwise mounted onto the insulated substrate 12. In other words, the substrate is non-conductive, providing insulation between the conductive paths 16. The substrate 12 may also be referred to as a printed circuit board or insulating board onto which the conductive path 16 or circuits are printed. Other substrate materials may be used, such as printing onto polyester film or other polymer films. The conductive material or ink utilized as the conductive path 16, may be screen printed using conductive ink as commonly known in the art and may include other methods of applying conductors as commonly known in the art. The conductive path 16 has a height or thickness on the order of 15-50 microns. The ink 16 is generally a conductive polymer thick film of the type Minico.

A circuit member is generally indicated at 18. The circuit member 18 may be in the form of any one of various types of electrical components, such as capacitors, resistors, integrated circuit, etc., or maybe in the form of other semi-conductors. Alternatively, circuit member 18 may be a second substrate mounted on a first substrate 12.

The circuit member 18 includes a discontinued protective, insulation or passivation layer 20 thereon providing electrical conductive surfaces or pads 22 recessed within the discontinuities. The contact pads 22 provide the means for external electrical connection with the circuit member 18, as commonly known in the art. The contact pads 22 are aligned vertically over selected ones of the conductive paths 16 in the "flip-chip" technique but used with a die without bumps thereon, herein after referred to by applicant under his trademark of "flip-die". Functionally, it is desirable to have uniaxial electrical conductivity between the conductive paths 16 and the contact pads 22, without electrical conductivity between laterally spaced conductive paths 16 or contact pads 22. The circuit member 18 with the passivation layer 20 is commonly known in the art and provides such contact pads 22 recessed therein prior to the common application of applying extending conductive terminals therefrom or "bumps".

Protruding means 24 is operatively provided between the contact pads 22 and a terminal or end portion 23 of the conductive paths 16 to decrease the distance or separation between the contact pads 22 and conductive paths 16, as will be subsequently discussed. In other words, the height protrusion of the terminal portion or end 23 of the conductive paths 16 vertically aligned with the recessed contact pads 22 is greater than the height protrusion of the conductive paths 16 vertically aligned with or under the passivation layer 20 providing a projection toward the recess 22, the heights taken with respect to the general plane of the substrate 12. The subject invention avoids the requirement of producing "bumps" or connecting terminal leads on the circuit member 18 of the prior art. The protruding means 24 may be any of several embodiments, as subsequently discussed.

A uniaxially conductive adhesive coating 26 is disposed over the mounting surface 14 for adhering the circuit member 18 to the substrate 12. The adhesive 26 includes a resin having approximately 40 or greater by weight conductive metal between the vertically aligned contact pads 22 and protruding means 24 of the terminal portion 23 of the conductive paths 16 and the resin is conductive vertically or uniaxially therebetween. The adhesive 26 includes about 20–25% by weight conductive metal between the laterally spaced contact pads 22 or conductive paths 16 and the resin is therefore non-conductive laterally therebetween. The lower percentage of metal filler in the adhesive 22 is not sufficient to support electrical current flow through the resin. The adhesive coating is of the type set forth in U.S. Pat. No. 4,667,401 issued May 26, 1987 in the name of Clements et al., and incorporated by reference herein and as subsequently discussed.

The resin is a dielectric preventing conductivity between spaced metal particles therein. As shown in the FIGS. 2–4, the percent by weight content of the metal particles in the resin is concentrated between the contact pads 22 and protruding means 24 of conductive paths 16 thereby decreasing the spacing between the metal particles. The decreased spacing allows conductivity through the resin providing conductivity between the aligned and protruding means 24 of the conductive paths 16. The metal particles suspended in the resin between laterally spaced contact pads 22 and protruding means 24 of the conductive paths 16 are not concentrated sufficiently to cause conduction. The resin prevents conductivity between spaced metal particles. The effect achieved is uniaxial conductivity between aligned conductive members 16, 22, 24 and insulation or non-conductivity therebetween.

In order to obtain the decreasing of space between the metal particles, the contact pads 22 and protruding means 24 must provide a lesser distance than the distance between the passivating layer 20 and the substrate 12. This occurs by increasing the height of the end 23 of the conductive path 16 aligned under the recessed contact pads 22. The three embodiments of the protruding means 24 will be hereinafter discussed. Primed reference numerals indicate similar components in each embodiment having the same base member.

Figure 2:
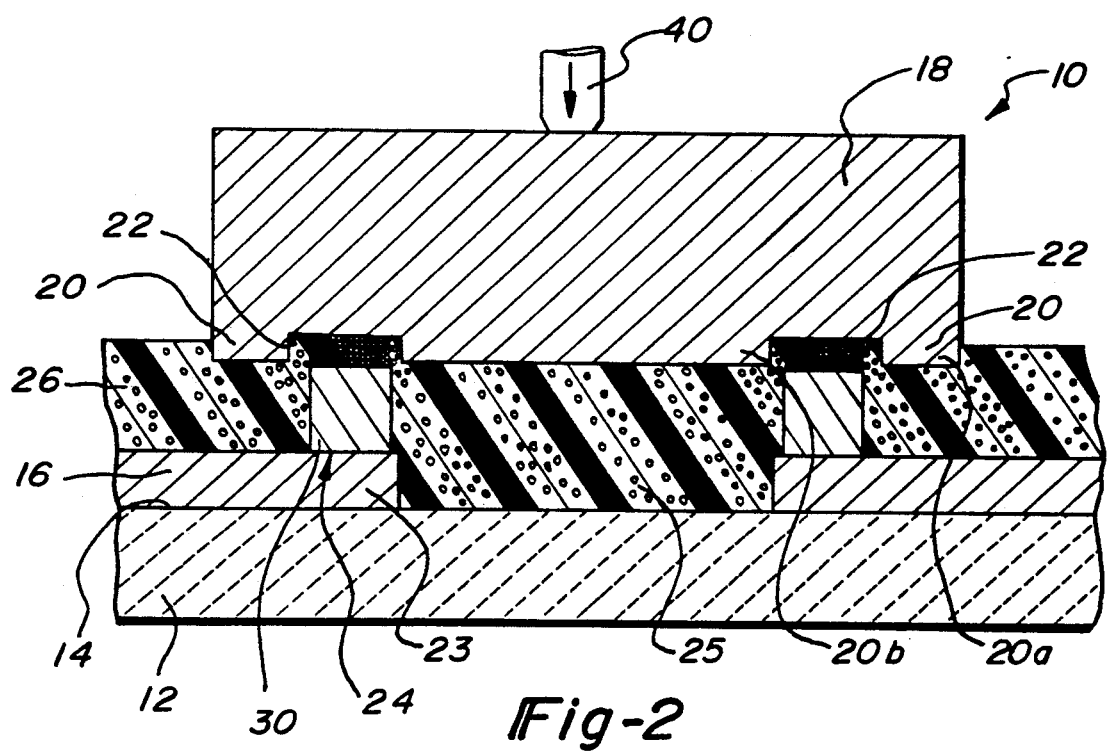
FIG. 2 is a cross-sectional view taken along lines 2—2 of FIG. 1 of a first embodiment of the subject invention.

In the first embodiment of the protruding means 24 illustrated in FIG. 2, a conductive pellet 30 is placed on the conductive path 16 at the end 23 thereof to provide the necessary protrusion toward the recessed contact pad 22 for diminishing the distance to the conductive contact pad 22. The conductive pellet 30 provides a protrusion of the conductive path 16 such that concentration of the metal particles in the resin will occur between the pellet 30 and contact pad 22 achieving uniaxial conductivity therebetween, while the portion 25 between the substrate 12 and the passivating layer 20 and the conductive paths 16 of the circuit member 18 remains nonconductive. The conductive pellet 30 has a thickness about half the thickness of the conductive path 16, i.e., 7-25 microns, in order to provide a protrusion height of 22-55 microns. A first method of applying the pellet 30 is to provide a second screening of the conductive ink isolated to the end 23 of the conductive path 16 which will be aligned with the recessed contact pad 22. The pellet 30 may also be added to the conductive path 16 by any of the following techniques: applying an conductive ink drop, applying a conductive adhesive by stenciling or screening, plating conductive metals, or any other method of forming a conductive pellet thereon. Each of the methods are commonly known in the art to form conductive material on substrates.

Figure 3:
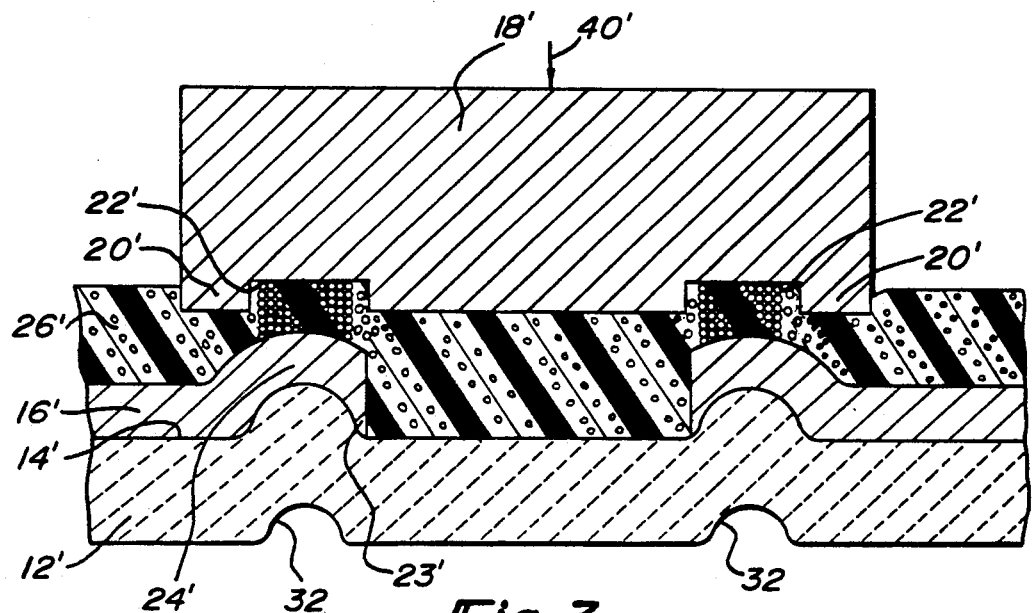
FIG. 3 is a cross-sectional view taken along lines 2—2 of FIG. 1 of a second embodiment of the subject invention.

The second embodiment of the protruding means 24', as illustrated in FIG. 3, may be formed by providing a recess or ridge 32' within the substrate 12'. The ridge 32' formed within the substrate 12' may be molded in the case of a rigid plastic substrate 12, e.g., printed circuit board, or embossed or debossed in the case of a flexible substrate, such as a polyester film. Conductive ink which is applied thereover forming the conductive path 16' will follow the contour of the substrate 12' creating the protrusion 24'. The conductive ink path 16 may be applied prior to embossing to provide similar results. The protrusion 24' will be aligned within the recess to allow concentration of the metal particles in the resin.

Figure 4:
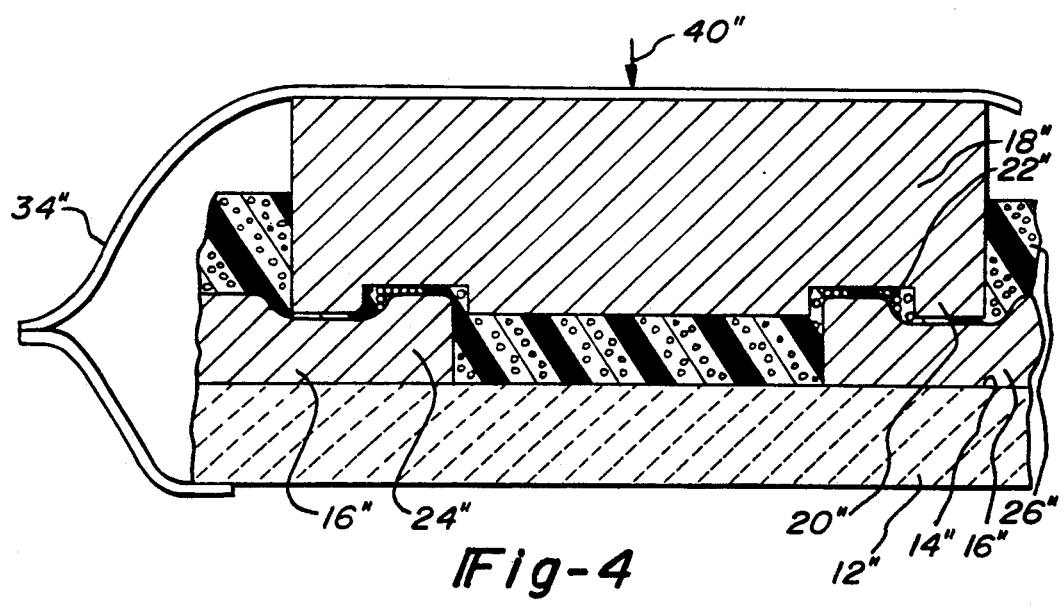
FIG. 4 is a cross-sectional view taken along lines 2—2 of FIG. 1 of a third embodiment of the subject invention.

The third embodiment of the protrusion means 24", as illustrated in FIG. 4, includes the ink applied as the conductive path 16", in the manner as commonly known in the art. With the adhesive 26" placed thereover, the circuit member 18" is pressed thereagainst wherein the passivating layer 20" is pressed and indented into the conductive path 16" forming a protrusion 24" which is aligned with the recessed contact pad 22". The formed protrusion 24" decreases the distance to the contact pads 22" for concentration of the adhesive 26 with the distance between the passivating layer 20 and substrate 12 remaining greater therefore allowing no concentration of the metal particles in the resin. A pressure of approximately 2 psi is required to deform the PTF 16", enough pressure to force the PTF into the recessed. The pressure must remain until the adhesive 26" and PTF 16" is cured. Alternatively, the substrate 12" and circuit member 18" combination may be laminated between two plastic sheets 34 or paper which retains the pressure on the substrate 12 and circuit member 18" to maintain the depressions in the conductive paths 16 and provide the projections 24". The lamination may be provided by adhesive treated paper, hot pressing plastic sheets, etc., the may provide the required pressure for any embodiment herein.

Figure 5:
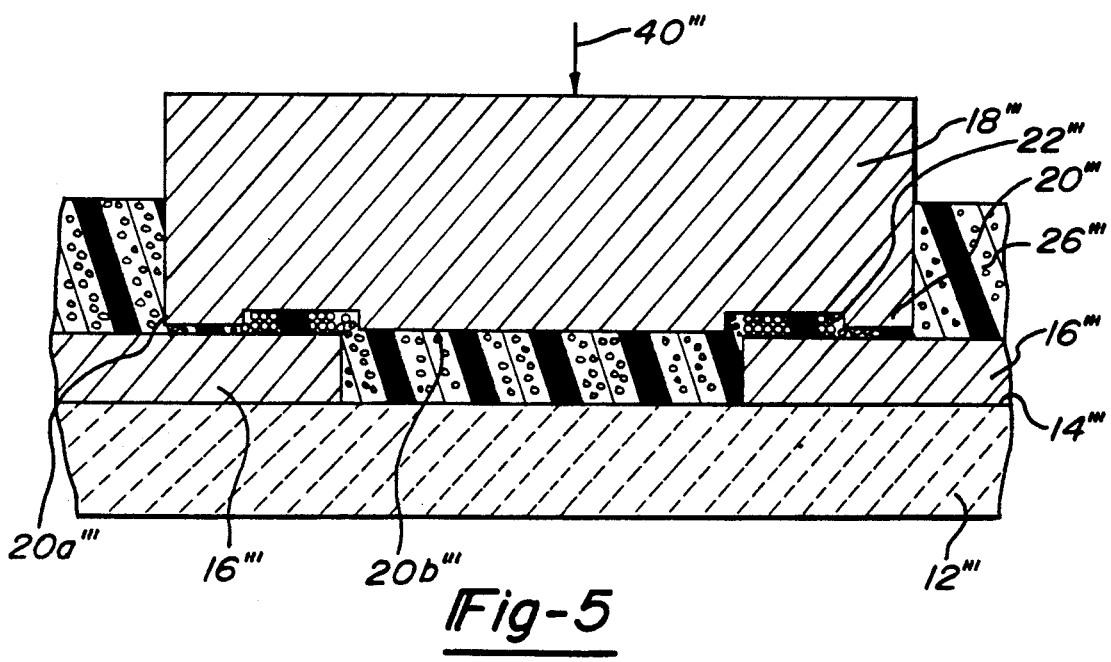
FIG. 5 is a cross-sectional view taken along lines 2—2 of FIG. 1 of a fourth embodiment of the subject invention.

A fourth embodiment is illustrated in FIG. 5 and omits use of the protruding means 24. The adhesive 26''' is placed over the substrate 12''' and flat conductive paths 16'''. The passivating layer 20''' has a thickness less than the thickness of the conductive path 16''' to allow concentration of the metal particles between the contact pad 22''' and the conductive path 16'''. Pressure is applied to the circuit member 18''' on the order of 1 psi, which is not sufficient to deform the ink of the conductive path 16'''.

In all embodiments, some concentration will occur between the perimeter passivation layer 20a and the conductive paths 16. However, this is irrelevant since the passivation layer 20 acts as an insulator. Furthermore, some concentrated group will occur vertically between the center portion of the passivation layer 20b and the substrate 12. However, it is irrelevant since both the passivation layer 20 and substrate 12 are insulators and no lateral concentration occurs in response to the applied pressure. Furthermore, the resin 26 seals the perimeter of the circuit member 18 with the substrate 12 and provides thermal conductivity therethrough to prevent over heating of the circuit member 18.

In any of the above embodiments, the adhesive 21 includes conductive metal particles in powder form or the alloy of the conductive metal particles in powder form. Conductive metals may be selected from the group including nickel, silver, graphite, palladium, platinum, gold, chromium, aluminum, cadmium, cobalt, copper, iron, indium, iridium, magnesium, molybdenum, tin, tungsten, zinc, gallium, germanium and antimony and other conductive materials. The metal powder may have a size of 0.1 microns to 40 microns. The size of the particles may be determined by the size of the components adhered together, larger components can be spaced further apart thereby allowing for larger size particles to be used.

The adhesive further includes a polymerized resin in its pure form or as a mixture of several types of resins. The resin may be selected from the group including epoxy resins and modified resins with hardeners such as epoxy novalac resins, acrylic resins and modified acrylic resins such as methlacrylic resin or n-butyl acrylic resin, polyester resins and modified thereof such as polyaclyates and polybutylene terephthalate, silicone resins such as methyl trimethoxysilane and ethylorthosilicate, phenoxy resins, polyurethane resins, polysulfide, cyanoacrylates, UV-curable polymers, and other well known adhesive resins. The resins are generally considered nonconductive in the polymerized state. However, pursuant to the subject invention, the resin is made conductive by the step of concentrating the metal powder mixed therein to between forty to fifty percent by weight.

The adhesive 26 is cured at a predetermined time and temperature as the pressure is applied between the substrate 12 and circuit member 18, i.e., a holding force maintains the circuit member 18 in predetermined closely spaced relationship to the conductive paths 16 of the substrate 12. Generally, the adhesive 26 may be cured at room temperature to 250° C. for a period of a few seconds to one hour, these values being dependent upon the adhesive used.

When the adhesive 26 is an ultraviolet curable adhesive, the curing step is accomplished by irradiating the adhesive 26 under an ultraviolet lamp for a predetermined amount of time.

Although the pressure may be varied dependent upon the size of the circuit member 18 being used, preferably, ounces to ten pounds of pressure per square inch is applied.

Initially, the adhesive 26 is prepared by mixing an adhesive resin and a metal powder together uniformly to suspend the metal powder within the adhesive. The adhesive is brought to a preferred viscosity, preferably between the range of 10,000 to 40,000 CPS. Most preferably, the viscosity of the adhesive mixture is between 15,000 to 20,000 CPS. The viscosity values may be varied dependent upon the nature of the metal powder, the viscosity determining the ability of the adhesive 26 to suspend the metal in a uniform mixture.

The instant invention provides an adhesive 26 for connecting the circuit member 18 having to the substrate 12 including the mounting surface 14 having the plurality of laterally spaced conductive paths 16. The adhesive 26 includes a mixture of the polymeric resin and twenty to twenty-five percent by weight of a pure conductive metal powder or alloy thereof uniformly suspended in the resin as a resin/metal suspension. The adhesive 26 is characterized by the resin being nonconductive as the resin/metal suspension and the resin being conductive when concentrated to include forty to fifty percent by weight of the metal.

The particular resin 26 used int eh following examples of the subject invention is sold by Polytel Circuits, Inc. under the tradename UNIAX and of the type ET210. Various other resins may be used having similar properties. The ET210 resin utilizes metal powder of a size of 0.1-3 microns and is applied to the substrate 12 of a thickness 3 mils. the conductive ink utilized in forming the conductive paths 16 was screen printed using Mini co M-4200 flexible silver loaded polymer thick file 0.7 mils thick. The substrate 12 utilized was of the type Melinex 516 U.V. treated for adhesion, 3 mils thick. The circuit member or die 18 utilized was of the type Sam Sung 14B having no bumps.

In a first example, a 2.5 micron pellet 30 was added to the conductive path 16. also tested and verified was the substrate 12' and conductive ink path 16' embossed by apply pressure to a blunt needle against the back side of the substrate 12'. The third embodiment was used by applying 2 psi of pressure against the circuit member 18" to deform the ink 16" and the pressure maintained until partial or full curing of the adhesive 26" to maintain the separation. Alternatively, all of the above embodiments were laminated to maintain the proper pressure during curing of the adhesive 26 to retain proper orientation between the circuit member 18 and substrate 12. The substrates 12 were measured for conductivity between conductors and infinite resistance was measured with no die 18 applied. With the die 18 applied, predetermined resistance was measured in several assemblies of the circuit by the above methods.

Each of the above methods have been applied to connect a circuit member 18 of the type by Realteck, RTS951 Sound Effect to a substrate 12 having conductive paths 16 leading to an LED, battery, switch, resistors, transistor and audio transducer. The circuit member 18 had the following contact pads 22 connected as follows: L3 and L2 terminals connected to the cathod of the LED diode, OSCI and OSCO connected to a first resistor, VDD terminal connected to the battery and anode of the diode and input of the audio transducer, GND terminal connected to the battery and switch, START B connected to the switch, and BO terminal connected to a resistor to the base of a transistor and to the audio transducer. Upon manual closing of the switch, an audio sound was produced and the LED illuminated.

The invention includes a method of connecting a circuit member 18 having the discontinued passivation layer 20 providing electrical contacts 22 recessed within the discontinuity to the substrate 12 which has the mounting surface 14 presenting the plurality of laterally spaced conductive paths 16 thereon with a portion thereof establishing raised conductive surfaces. The method includes the steps of applying the adhesive 26 including the resin having a 20-25 percent by weight content of the conductive metal particles over the mounting surface 14 of the substrate 12 which adhesive is unconcentrated and non-conductive. Preferably, the adhesive 26 is applied in a layer greater than 20 microns over the entire surface, i.e., the conductive and nonconductive portions to an even upper surface. Alternatively, the adhesive 26 may be applied in an amount so as to secure the circuit member 18 to the substrate 12 or in an amount covering all electrical components and thereby providing an effective environmental seal.

The circuit member 18 is mounted on the adhesive 26 while vertically aligning the contact pads 22 over preselected ones of the conductive paths 16. Also included is applying pressure to concentrate the percent by weight content of the conductive metal particles in the adhesive 26 between each contact pad 22 and vertically aligned raised conductive path 16 to between 40-50% by weight by decreasing the space in between the metal particles making the resin conductive vertically therebetween, while the resin in the unconcentrated adhesive remains nonconductive between laterally spaced contact pads 22 and the conductive paths 16. In other words, if the metal in the cured adhesive 26 between the contact pads 22 and the raised surfaces of the conductive paths 16 is increased or concentrated from between 20 and 25 percent to between 40-50 percent by weight, there is conductivity in these concentrated regions and no conductivity in the unconcentrated regions therebetween. Hence, the instant method effectively provides a uniaxially conductive adhesive which is conductive between aligned contact pads 22 and raised surfaces of conductive paths 16 but is nonconductive between laterally spaced contact pads 22 and conductive paths 16. The phenomenon of conductivity through the adhesive 26 between concentrated metal particles is called tunneling effect, as commonly known in the art. Actual physical touching of metal particles is not required.

The concentration of the metal and the adhesive is concentrated by applying pressure between the contact pads 22 and the vertically aligned conductive paths 16 to concentrate the conductive metal therebetween. As illustrated in FIG. 2 a pressure applying member 40 can be used to apply pressure against the circuit member 18 thereby effectively applying pressure between the contact pads 22 and conductive path 16 as the two are moved together. Such pressure concentrates the metal in the adhesive 26 between the contact pads 22 and the conductive path 16 while not concentrating the adhesive between laterally contact pads 22 and conductive paths 16. Preferably, pressure may be applied from one to two pounds per square inch dependent upon the size of the circuit member 18. Hence, the adhesive 26 must be concentrated into the preferred range of 40-50% metal content at each contact pad 22 for complete conductivity. The pressure is maintained until partial curing of the adhesive 26.

Also included is the step of forming protruding or raised conductive surface 24 on the conductive path 16 to further decrease the separation between the contact pads 22 and conductive path 16. The raised conductive surface 24 have a height protrusion greater than the height protrusion of the conductive path 16 vertically aligned with the insulation layer. the concentrated metal in the adhesive 26 therebetween.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

I claim:

1. A method of forming an electronic device the method including the step of:

forming an electronic circuit member (18) having a discontinuous insulation layer (20) establishing recessed contact pads (22) within the discontinuities of the insulation layer (20), placing the electronic circuit member (18) on a substrate (12) with a mounting surface (14) having conductive paths (16) thereon and vertically aligning the contact pads (22) with raised conductive surfaces (24) on the substrate which raised conductive surfaces (24) have a height protrusion greater than the height protrusion of the conductive path vertically aligned with the insulation layer, and providing an adhesive (26) between the circuit member (18) and the substrate (12) having a resin and spaced conductive metal particles suspended therein with concentrated conductive particles between the raised conductive surfaces and contact pads allowing conductivity through the resin making the resin uniaxially conductive vertically therebetween while maintaining the adhesive (26) between laterally spaced contact pads and conductive paths in the unconcentrated and nonconducting states.

2. A method as set forth in claim 1 wherein said forming step is further defined as applying an adhesive (26) including a resin with spaced conductive metal particle suspended therein over the mounting surface of the substrate having conductive paths wherein the resin is a dielectric preventing conductivity between the spaced metal particles therein.

3. A method as set forth in claim 1 wherein said step of forming is further defined as applying pressure against the circuit member (18) and the conductive paths to flow the resin out from between the electrical contact pads (22) and conductive paths (16) to concentrate the conductive metal particles in the resin between each electrical contact pad (22) and vertically aligned raised conductive surfaces (24) and to decrease space in between the metal particles allowing conducting through the resin and making the resin uniaxially conductive vertically between the electrical contact pads and conductor paths while maintaining the adhesive between laterally spaced electrical contact pads and conductive paths in the unconcentrated and nonconducting state.

4. A method as set forth in claim 3 wherein said step of forming is further defined as forming raised conductive surfaces (24) on a portion of the conductive path.

5. A method as set forth in claim 4 wherein the step of forming is further defined as mounting the circuit member (18) on the adhesive while vertically aligning the electrical contact pads (22) over preselected ones of the raised conductive surfaces (24).

6. A method as set forth in claim 5 wherein said step of forming raised conductive surfaces is further defined as applying a pellet (24) to the conductive paths (16) aligned with said contact pads (22) increasing the height of the pellet (24) greater than the conductive path (16) with respect to the substrate (12).

7. A method as set forth in claim 5 wherein said step of forming raised conductive surfaces (24') is further defined as forming a ridge in the substrate (12') with the conductive paths (16') formed thereover providing the raised conductive surfaces on the ridge.

8. A method as set forth in claim 4 wherein said step of forming raised conductive surfaces (24") is further defined as applying a deformable conductive ink as the conductive path and applying pressure to the circuit member to deform the conductive paths to allow same to project into the recessed contact pads.

9. An electronic device comprising:

a circuit member (18) including a discontinued insulation layer (20) which provides electrical contact pads (22) recessed within the discontinuities, a substrate (12) including a mounting surface (14) having a plurality of laterally spaced conductive paths (16) thereon with a portion of said conductive paths establishing raised conductive surfaces (24) vertically aligned with the recessed contact pads, said conductive surfaces have a protruding height greater than the protruding height of the conducting paths vertically aligned with the insulation layer;

an adhesive layer (26) coating the conductive paths (16) of the mounting surface for adhering the circuit member (18) to the substrate (12), the adhesive (26) including concentrated conductive metal particles between said vertically aligned contact pads and raised conductive surfaces and being uniaxially conductive vertically therebetween, and unconcentrated and non-conductive between laterally spaced conductive pads and raised conductive surfaces wherein the resin is a dielectric preventing conductivity between the metal particles therein and being non-conductive laterally therebetween.

10. An electronic device set forth in claim 9 wherein said raised conductive surfaces (24) comprises a conductive ink pellet applied to said conductive path (16).

11. An electronic device set forth in claim 9 wherein said substrate (12) comprises a mold ridge wherein said conductive paths formed thereon establishes said raised conductive surfaces (24').

12. An electronic device set forth in claim 9 wherein said raised conductive surfaces (24") comprises a deformable conductive material deformed to extend to said contact pads (22) with said discontinuities.

13. A method of forming an electronic device, the method including the steps of:

providing a substrate having laterally spaced conductive paths thereon, applying an adhesive on the substrate having a resin and spaced conductive metal particles suspended therein being in an unconcentrated and non-conductive state, placing an electronic circuit member having a discontinuous insulation layer establishing recessed contact pads over the adhesive with the contact pads vertically aligned with selective conductive paths, and applying pressure to the circuit member against the substrate to concentrate conductive particles between the conductive paths and contact pads allowing conductivity through the adhesive making the adhesive uniaxially conductive vertically therebetween while maintaining the adhesive between laterally spaced contact pads and conductive paths as unconcentrated and nonconductive vertically between the substrate and circuit member.

14. A method as set forth in claim 13 further including forming raised contact surfaces on the conductive paths vertically aligned with the contact pads to decrease the separation therebetween.

15. A method as set forth in claim 13 further including applying the adhesive over the substrate and extending between adjacent conductive paths, and placing the circuit member and applying the pressure such that conductivity is established between vertically aligned contact pads and conductive path, and the adhesive between conductive paths is in the unconcentrated and nonconductive state vertically between the layer substrate and insulation.

16. A method as set forth in claim 13 further including curing the adhesive while applying the pressure to maintain the circuit member against the substrate with the adhesive in the establish conductive and nonconductive states upon release of the pressure.

17. A method as set forth in claim 13 further including spacing the insulation layer and substrate at a separation greater than the separation between the contact pads and the conductive path.

* * * * *